US012761297B2

(12) United States Patent
Wang et al.

(10) Patent No.: US 12,761,297 B2
(45) Date of Patent: Oct. 13, 2026

(54) POWER SUPPLY ADJUSTMENT METHOD, POWER SUPPLY APPARATUS, PORTABLE COMPONENT AND MAGNETIC RESONANCE DEVICE

(71) Applicant: Siemens Healthineers AG, Forchheim (DE)

(72) Inventors: JianMin Wang, Shenzhen (CN); Markus Vester, Nuremberg (DE)

(73) Assignee: Siemens Healthineers AG, Erlangen (DE)

( * ) Notice: Subject to any disclaimer, the term of this patent is extended or adjusted under 35 U.S.C. 154(b) by 747 days.

(21) Appl. No.: 18/071,840

(22) Filed: Nov. 30, 2022

(65) Prior Publication Data

US 2023/0168321 A1 Jun. 1, 2023

(30) Foreign Application Priority Data

Nov. 30, 2021 (CN) ......................... 202111441324.5

(51) Int. Cl.
*G01R 33/28* (2006.01)
*G01R 33/36* (2006.01)
*G01R 33/385* (2006.01)
*H02M 3/00* (2006.01)
*H03K 7/08* (2006.01)

(52) U.S. Cl.
CPC ............ *G01R 33/28* (2013.01); *G01R 33/36* (2013.01); *G01R 33/3852* (2013.01); *H02M 3/015* (2021.05); *H03K 7/08* (2013.01)

(58) Field of Classification Search
CPC .... G01R 33/28; G01R 33/36; G01R 33/3852; G01R 33/3607; G01R 33/3614; G01R 33/3664; H02M 3/015; H02M 1/0045; H03K 7/08; Y02B 70/10
See application file for complete search history.

(56) References Cited

U.S. PATENT DOCUMENTS

2010/0090699 A1* 4/2010 Haans ................ G01R 33/3664 324/322
2016/0294274 A1* 10/2016 Wennerstrom ...... H01F 27/2823
(Continued)

FOREIGN PATENT DOCUMENTS

CN 107026663 A 8/2017
CN 109104172 A 12/2018
CN 109388330 A 2/2019

*Primary Examiner* — Rishi R Patel
(74) *Attorney, Agent, or Firm* — Banner & Witcoff, Ltd.

(57) ABSTRACT

A power supply adjustment method may include: providing a pulse-width modulation (PWM) signal, a duty cycle of the PWM signal being preset to a fixed value; performing PWM processing on an input signal by using the PWM signal to obtain a first modulation signal; performing first filtering processing on the first modulation signal to obtain a second modulation signal; and performing linear adjustment processing on the second modulation signal to output a target signal. According to the power supply adjustment method, the power supply apparatus, the portable component, and the magnetic resonance device provided in the present disclosure, interference of noise generated by PWM on the portable component can be reduced, thereby reducing requirements for a shielding component, further reducing a weight of the portable component in the magnetic resonance device and improving portability.

17 Claims, 10 Drawing Sheets

(56) References Cited

U.S. PATENT DOCUMENTS

| | | | | |
|---|---|---|---|---|
| 2017/0180013 | A1 | 6/2017 | Kuttan et al. | |
| 2019/0044505 | A1* | 2/2019 | Yabuzaki | G01R 19/252 |
| 2021/0367567 | A1* | 11/2021 | Lesso | H03F 3/2171 |

* cited by examiner

POWER SUPPLY ADJUSTMENT METHOD, POWER SUPPLY APPARATUS, PORTABLE COMPONENT AND MAGNETIC RESONANCE DEVICE

CROSS REFERENCE TO RELATED APPLICATIONS

This patent application claims priority to Chinese Patent Application No. 202111441324.5, filed Nov. 30, 2021, which is incorporated herein by reference in its entirety.

BACKGROUND

Field

The present disclosure relates to the field of medical device technologies, and in particular, to a power supply adjustment method, a power supply apparatus, a portable component, and a magnetic resonance device.

Related Art

Magnetic resonance devices can perform imaging by using the principle of magnetic resonance, so that they are widely applied in many technical fields such as medicine. In the related art, in order to make the use of the magnetic resonance device more flexible, components such as a receiving antenna are separated from the magnetic resonance device and used as a portable component.

In addition, in order to reduce the power consumption of the portable component, a switching power supply (such as a direct current-direct current (DC-DC) converter) is usually used to supply power to the portable component. Furthermore, a shielding component needs to be provided, to reduce an impact of noise generated by the switching power supply on the normal operation of the portable component.

However, the portable component in the related art is heavy and inconvenient to carry.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1B is a spectrogram of noise generated by a coil loop of a conventional portable component after a switching power supply is switched on.

Figure 1A:
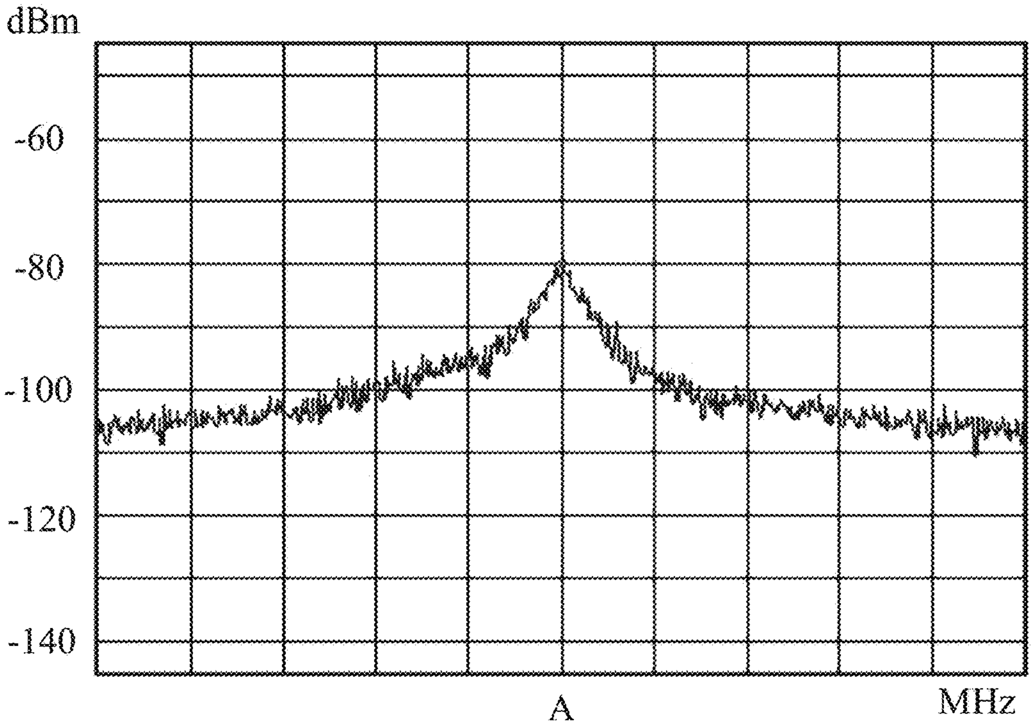
FIG. 1A is a spectrogram of noise generated by a coil loop of a conventional portable component after a switching power supply is switched off.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide a power supply adjustment method, a power supply apparatus, a portable component, and a magnetic resonance device in an aspect, to reduce a weight of a portable device in the magnetic resonance device.

According to an embodiment of a first aspect of the present disclosure, there is provided a power supply adjustment method applied to a portable component of a magnetic resonance device, including: providing a pulse-width modulation (PWM) signal, a duty cycle of the PWM signal being preset to a fixed value; performing PWM processing on an input signal by using the PWM signal to obtain a first modulation signal; performing first filtering processing on the first modulation signal to obtain a second modulation signal; and performing linear adjustment processing on the second modulation signal to output a target signal.

According to an embodiment of a second aspect of the present disclosure, there is provided a power supply apparatus, including: a PWM signal generator configured to provide a PWM signal, a duty cycle of the PWM signal being preset to a fixed value; an input signal processor configured to perform PWM processing on an input signal by using the PWM signal to obtain a first modulation signal; a first filter, an input terminal of the first filter being connected to the input signal processor, and the first filter being configured to perform first filtering processing on the first modulation signal to obtain a second modulation signal; and a linear regulator, an input terminal of the linear regulator being connected to an output terminal of the first filter, and the linear regulator being configured to perform linear adjustment processing on the second modulation signal to output a target signal.

According to an embodiment of a third aspect of the present disclosure, there is provided a portable component used in a magnetic resonance device, including: a component body configured to receive a detection signal; and the power supply apparatus configured to implement the method as described above or the power supply apparatus as described above, the power supply apparatus being connected to the component body, to supply power to the component body.

According to an embodiment of a fourth aspect of the present disclosure, there is provided a magnetic resonance device, including: a device body; and the portable component as described above, the portable component being communicatively connected to the device body.

According to the power supply adjustment method, the power supply apparatus, the portable component, and the magnetic resonance device provided in the embodiments of the present disclosure, PWM processing is performed on the input signal by using the PWM signal, and first filtering processing and linear adjustment processing are performed on the processed signal, so that interference of noise generated by the PWM processing on the operation of the portable component can be reduced, thereby reducing requirements for a shielding component, further reducing a weight of the portable component in the magnetic resonance device, and improving portability.

To reduce power consumption of a portable component, a switching power supply may be used to supply power to the portable component. However, during operation of the switching power supply, PWM and a harmonic component may cause strong interference to the portable component, thereby affecting normal operation of the portable component.

Conventionally, to ensure the normal operation of the portable component, a shielding component needs to be provided in the portable component, to reduce or eliminate interference as much as possible.

Figure 1B:
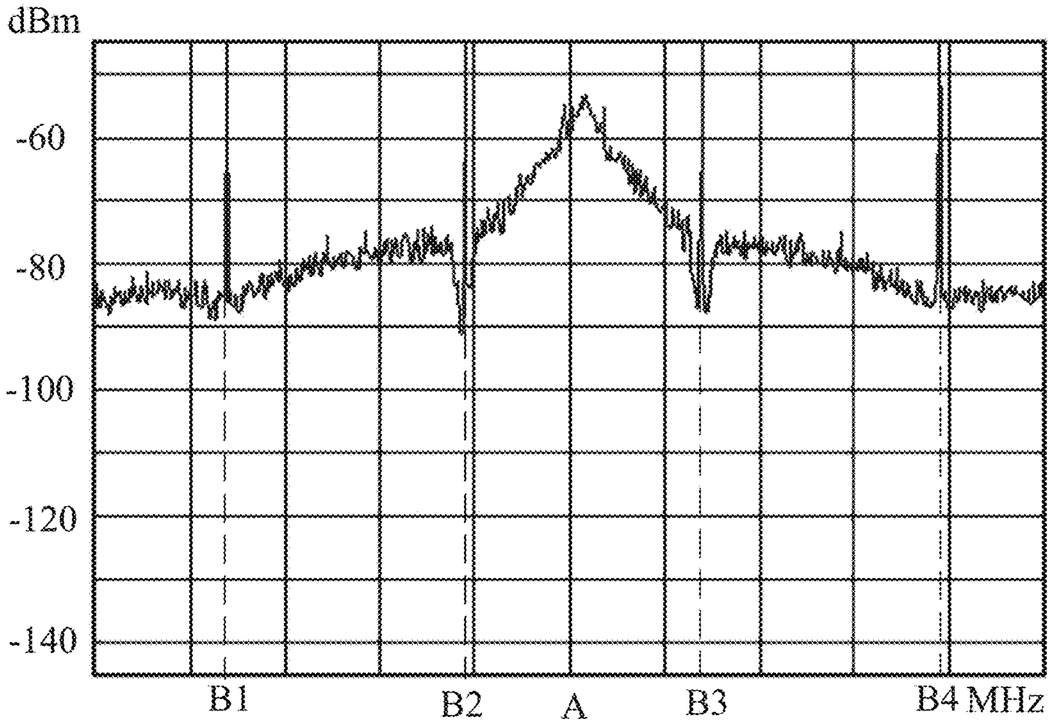

FIG. 1A is a spectrogram of noise generated by a coil loop of a conventional portable component after a switching power supply is switched off. FIG. 1B is a spectrogram of noise generated by a coil loop of a conventional portable component after a switching power supply is switched on.

Referring to FIG. 1A and FIG. 1B, the switching power supply may be switched on and off continuously during operation, consequently causing harmonic interference. The harmonic interference usually occurs at a frequency being an integral multiple of switching frequency. For example, if the switching frequency is 2.5 MHz, harmonic interference may occur at k×2.5 MHz, where k is an integer. If the switching frequency is 2.5 MHz, harmonic interference may occur at 60 MHz, 62.5 MHz, and 65 MHz. However, operating frequency of a receiver (that is, a portable component) of a magnetic resonance device is usually 63.6 MHz±300 kHz. Selecting a high-frequency switching power supply may prevent the operating frequency of the receiver from falling within frequencies of the harmonic interference, so that the harmonic interference may be avoided. As shown in FIG. 1B, harmonic interference occurs at the frequencies respectively corresponding to B1, B2, B3 and B4. A frequency corresponding to A is the operating frequency of the receiver of the magnetic resonance device, and the frequencies at which the harmonic interference occurs are staggered with the operating frequency A of the receiver, so that an impact of the harmonic interference on the portable component may be avoided.

However, referring to both FIG. 1A and FIG. 1B, at a receiving frequency A of the receiver, noise in FIG. 1A is approximately −80 dB, but noise in FIG. 1B is approximately −60 dB. It can be seen that during operation of the switching power supply, even if the harmonic interference is reduced by selecting the high-frequency switching frequency, the background noise level is still increased by about 20 dB, and therefore a shielding component is required to reduce the interference. In addition, due to high sensitivity of the magnetic resonance device to an electromagnetic signal, there is a higher requirement for a shielding component. It is necessary to add a shielding component capable of shielding noise of at least 30 dB to the portable device, to shield the noise of 20 dB, which increases a size and a weight of the shielding component, further increasing a size and a weight of the portable component in the magnetic resonance device, and reducing portability.

To solve at least one of the above problems, the embodiments of the present disclosure provide a power supply adjustment method, a power supply apparatus, a portable component, and a magnetic resonance device, according to which, PWM processing is performed on an input signal by using a PWM signal with a fixed duty cycle or a duty cycle changing very slowly, and first filtering processing and linear adjustment processing are performed on a processed signal, so that interference of noise generated by the PWM processing on the portable component can be reduced, thereby reducing requirements for a shielding component, further reducing the size and weight of the portable component, and improving the portability.

Figure 2:
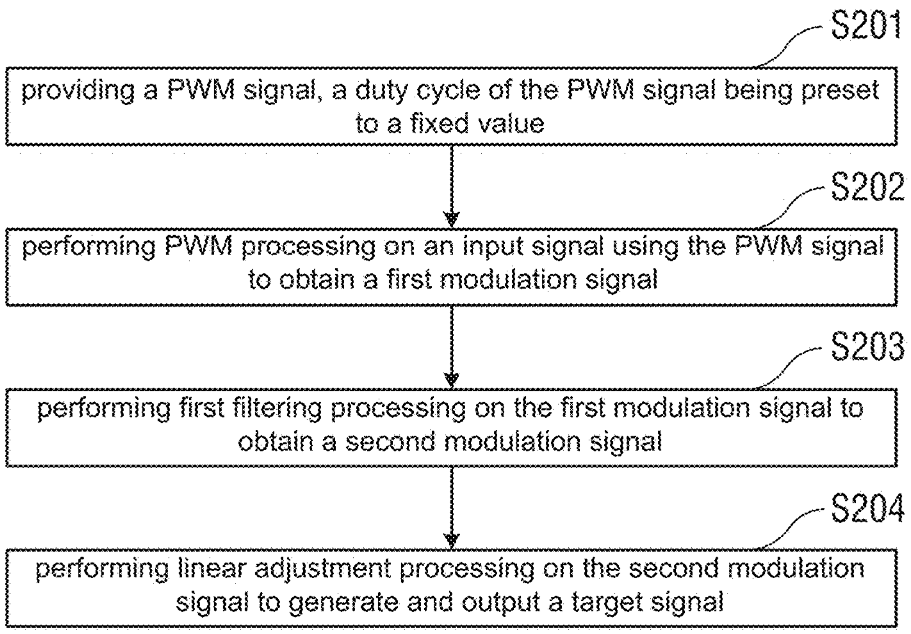
FIG. 2 is a flowchart of a power supply adjustment method according to an exemplary embodiment of the present disclosure.

FIG. 2 is a flowchart of a power supply adjustment method according to an embodiment of the present disclosure. Referring to FIG. 2, the embodiment provides a power supply adjustment method applied to a portable component of a magnetic resonance device, and the method includes steps S201 to S204.

In step S201, a PWM signal is provided, a duty cycle of the PWM signal being preset to a fixed value.

In step S202, PWM processing is performed on an input signal by using the PWM signal to obtain a first modulation signal.

In step S203, first filtering processing is performed on the first modulation signal to obtain a second modulation signal.

In step S204, linear adjustment processing is performed on the second modulation signal to output a target signal.

The portable component may be a receiver or another component of the magnetic resonance device that is very sensitive to noise, and the portable component may be configured to be in contact with or be placed near a person to be detected, to receive a detection signal for imaging.

In step S201, the duty cycle of the PWM signal is preset to a fixed value, the duty cycle may be set according to requirements, and in the embodiment, the duty cycle may be maintained at the fixed value.

In step S202, the input signal may be processed by using the PWM signal with the fixed duty cycle to obtain the first modulation signal. The input signal may be a voltage signal, and in some embodiments, may be a DC voltage signal. The first modulation signal may be obtained after the PWM processing is performed on the input signal, and through the PWM processing, the input signal may be changed to the first modulation signal with the fixed duty cycle.

Then, first filtering processing may be performed on the first modulation signal. The first filtering processing may be low-pass filtering processing. Through the low-pass filtering processing, a high-frequency part of the first modulation signal may be removed from the first modulation signal to obtain the second modulation signal, and background noise around a harmonic frequency generated by PWM processing may be limited, thereby reducing requirements for a shielding component.

Next, linear adjustment processing may be performed on the second modulation signal by using a linear regulator. The linear regulator may implement linear adjustment of a voltage, with the voltage used as an example. For example, magnitude of the second modulation signal may be changed by changing a resistance value of an access circuit of the linear regulator, so as to obtain the target signal, which may be an output voltage. In addition, in some embodiments, since a small amount of loss may be caused by the linear adjustment processing, a voltage value of the second modulation signal is higher than that of the target signal, and a difference between the two may be relatively small, for example, 0.1 V.

It may be understood that in the related art, during operation of the switching power supply, an increase in the noise level is due to an impact of strong phase noise generated by the PWM processing, that is, although the switching frequency is fixed at 2.5 MHz, the harmonic interference can only occur at a frequency being a multiple of 2.5 MHz. However, since the duty cycle of the PWM changes quickly, an increase in the noise level of the magnetic resonance device may still be caused.

However, the portable component has basically constant power consumption, there is a very small fluctuation in the output voltage, and there is a relatively small requirement for fast adjustment of the duty cycle. Therefore, in the embodiment, the input signal is processed by using the PWM with the fixed duty cycle, so that noise interference caused by fast changes in the duty cycle on the portable component may be reduced, and requirements for a shielding component may be further reduced. In addition, since there is a very small fluctuation in the output voltage, the output voltage may be quickly stabilized through the linear adjustment processing, and less power consumption is required in the adjustment process.

In addition, the first filtering processing is provided, which may further limit a harmonic frequency component and background noise around a magnetic resonance frequency generated by the PWM processing, and may further reduce the requirements for a shielding component.

In conclusion, the embodiment may reduce the requirements for a shielding component, reduce the size and weight of the portable component, and make the portable component easy to carry. In addition, in the method, the input signal is adjusted through PWM processing, so that power consumption may be reduced, voltage adjustment can be efficiently implemented, an impact of the voltage adjustment process on the portable component can be reduced, and good electromagnetic compatibility can be implemented.

Figure 3:
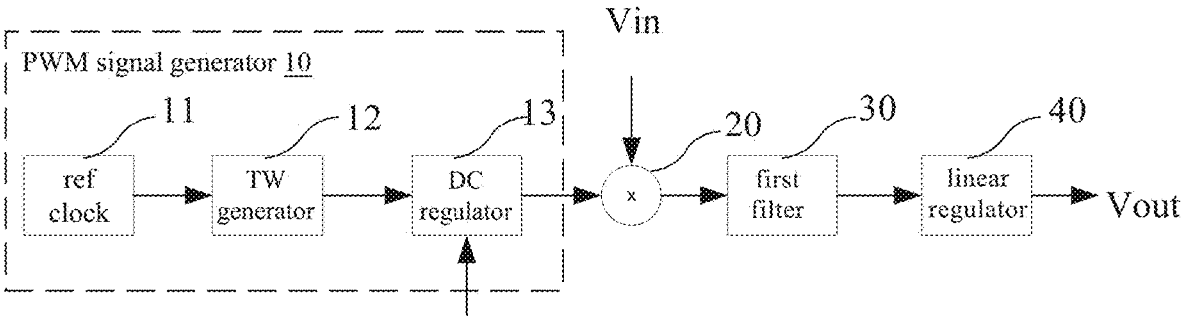
FIG. 3 is a schematic structural block diagram of a power supply apparatus according to an exemplary embodiment of the present disclosure and configured to implement the method in FIG. 2.

FIG. 3 is a schematic structural block diagram of a power supply apparatus implementing the method in FIG. 2 according to an embodiment of the present disclosure. Referring to FIG. 3, in some embodiments, a PWM signal may be generated by a PWM signal generator 10, and the PWM signal generator 10 may include a reference clock 11, a triangular wave generator 12, and a duty cycle regulator 13. A triangular wave with a specific frequency may be generated by inputting the reference clock 11 into the triangular wave generator 12, a fixed value may be input into the duty cycle regulator 13 to adjust the fixed duty cycle, and the triangular wave may be processed by using the duty cycle regulator 13 to obtain a square wave signal with a fixed duty cycle. In an exemplary embodiment, the PWM signal generator 10 includes processing circuitry that is configured to perform one or more functions of the PWM signal generator 10.

The input signal processor 20 may perform one or more signal processing operations, including multiplication processing on the input signal Vin and the obtained square wave signal with a fixed duty cycle, so as to obtain the first modulation signal. In an exemplary embodiment, the input signal processor 20 may be implemented by a totem pole circuit. In an exemplary embodiment, the input signal processor 20 includes processing circuitry that is configured to perform one or more functions of the input signal processor 20.

Then, the first modulation signal may be input into a first filter 30, and the first filtering processing may be implemented by using the first filter 30, so as to limit the background noise around the harmonic frequency generated by the PWM processing. In an exemplary embodiment, the filter 30 includes processing circuitry that is configured to perform one or more functions of the filter 30.

The second modulation signal obtained by using the first filter 30 may be adjusted by using a linear regulator 40, to output a target voltage Vout. The linear regulator 40 may be of a structure capable of implementing linear adjustment in the prior art, for example, a low-dropout voltage regulator. In an exemplary embodiment, the linear regulator 40 includes processing circuitry that is configured to perform one or more functions of the linear regulator 40.

The power supply apparatus shown in FIG. 3 may implement constant voltage adjustment between the input signal Vin and the second modulation signal obtained by using the first filter 30, and the linear voltage regulator 30 may reduce fluctuation in the target signal Vout. In addition, since a small amount of loss may be caused during operation of the linear regulator 40, a voltage value of the second modulation signal output by the first filter 30 should be slightly, for example, 0.1 V, higher than that of the target signal Vout.

In the above embodiment, the input signal is processed by using the PWM signal with a fixed duty cycle, and in some embodiments, the method further includes: adjusting the duty cycle of the PWM signal by using a feedback loop having an integration loop, where the first modulation signal or the second modulation signal is used as input of the feedback loop.

It may be understood that when the input signal fluctuates, to implement stable target signal output, the PWM signal may be adjusted by using the feedback loop having an integration loop, and the integration loop may further make the duty cycle be adjusted at a relatively slow speed.

Due to a slow change in the duty cycle, severe background noise may not be generated, so that requirements for a shielding component may be reduced, and stable output may also be implemented. The relatively slow speed is specific to the frequency of PWM. For adjustment with a frequency of 2.5 MHz, 1/20 of which, that is, about 100 kHz may be used.

Figure 4:
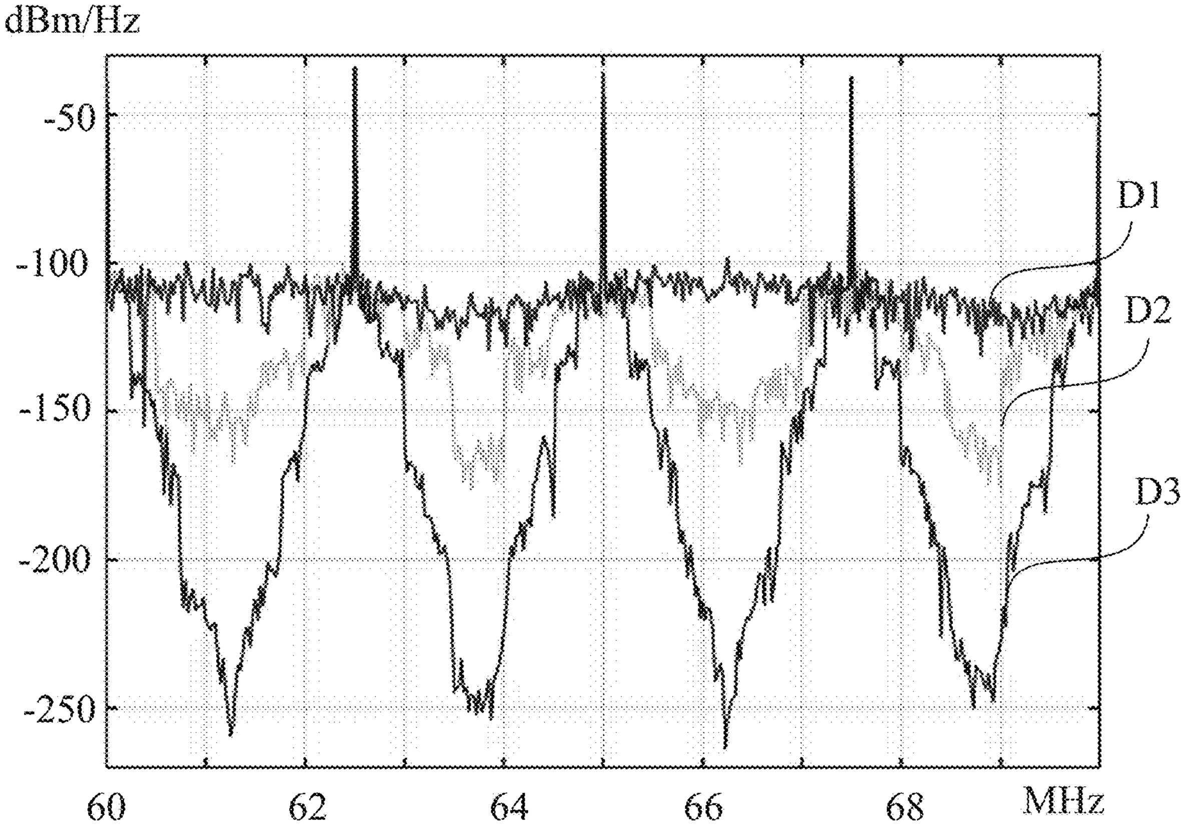
FIG. 4 is a diagram showing changes of power density of background noise, generated by PWM processing, as a function of frequency, according to an exemplary embodiment of the present disclosure.

FIG. 4 is a diagram showing changes of power density of background noise, generated by PWM processing, as a function of frequency. Referring to FIG. 4, to better illustrate an impact of changes in a duty cycle on background noise, PWM processing is simulated in the embodiment. It is assumed that the duty cycle changes randomly, a standard difference between the changes is 1% of a pulse width, a frequency of PWM is 2.5 MHz, an average duty cycle is set to 0.452, and a simulation time is 1 s. Since the simulation time is 1 s, the unit of the power density of the background noise in the ordinate in FIG. 4 is dBm/Hz. The standard for signal strength is the total power of 1 mW or the total output power of 0.452 mW at a duty cycle of 100%. The duty cycle DC may change according to the following formula:

$$DC=0.452\times(1+\varepsilon)$$

where $<\varepsilon 2>=0.01$, that is, ε is a random number with a standard difference of 0.01.

FIG. 4 shows a total of three curves D1, D2, and D3. D1 represents power density of background noise generated when the first filtering processing is not provided, D2 represents power density of background noise generated after processing by an ideal low-pass filter with a bandwidth of ±500 kHz, and D3 represents power density of background noise generated after processing by an ideal low-pass filter with a bandwidth of ±250 kHz. The operating frequency of the portable component (the receiver of the magnetic resonance device) is approximately 63.6 MHz±300 kHz.

It can be seen that an interference of approximately −120 dBm/Hz to −110 dBm/Hz is generated when the first filtering processing is not provided, which has a severe impact on the magnetic resonance device.

After the first filtering processing, the noise level is greatly reduced, where D3 represents a simulation result obtained when the fluctuation in the pulse width is limited to ±250 kHz, and D2 represents a simulation result obtained when the fluctuation in the pulse width is limited to ±500 kHz. In addition, an amount of reduction in the power density of the background noise is also related to the bandwidth of the low-pass filter around the harmonic frequency of 2.5 MHz.

It can be seen from FIG. 4 that the first filtering processing may limit the background noise around the harmonic frequency.

Figure 5:
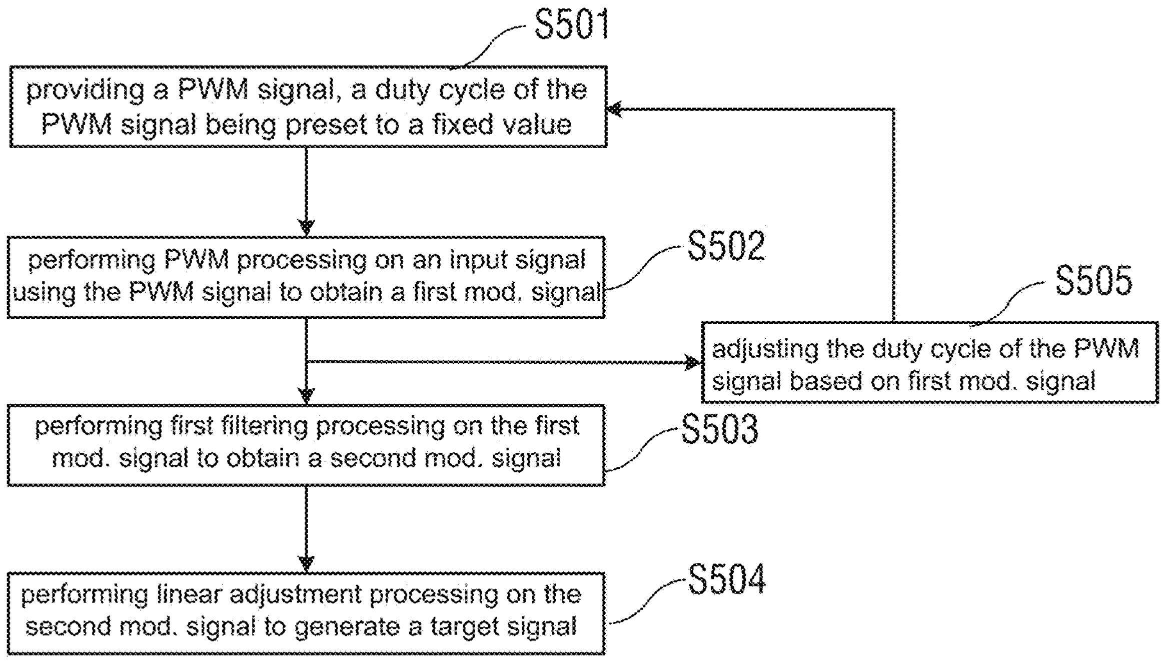
FIG. 5 is a flowchart of a power supply adjustment method according to an exemplary embodiment of the present disclosure.

FIG. 5 is a flowchart of a power supply adjustment method according to another embodiment of the present disclosure. Referring to FIG. 5, the embodiment further provides a power supply adjustment method. The method includes steps S501 to S505.

In step S501, a PWM signal is provided, a duty cycle of the PWM signal being preset to a fixed value.

In step S502, PWM processing is performed on an input signal by using the PWM signal to obtain a first modulation signal.

In step S503, first filtering processing is performed on the first modulation signal to obtain a second modulation signal.

In step S504, linear adjustment processing is performed on the second modulation signal to output a target signal.

The method further includes step S505: using the first modulation signal as input of a feedback loop having an integration loop, and adjusting the duty cycle of the PWM signal in step S501 by using the feedback loop.

Figure 6:
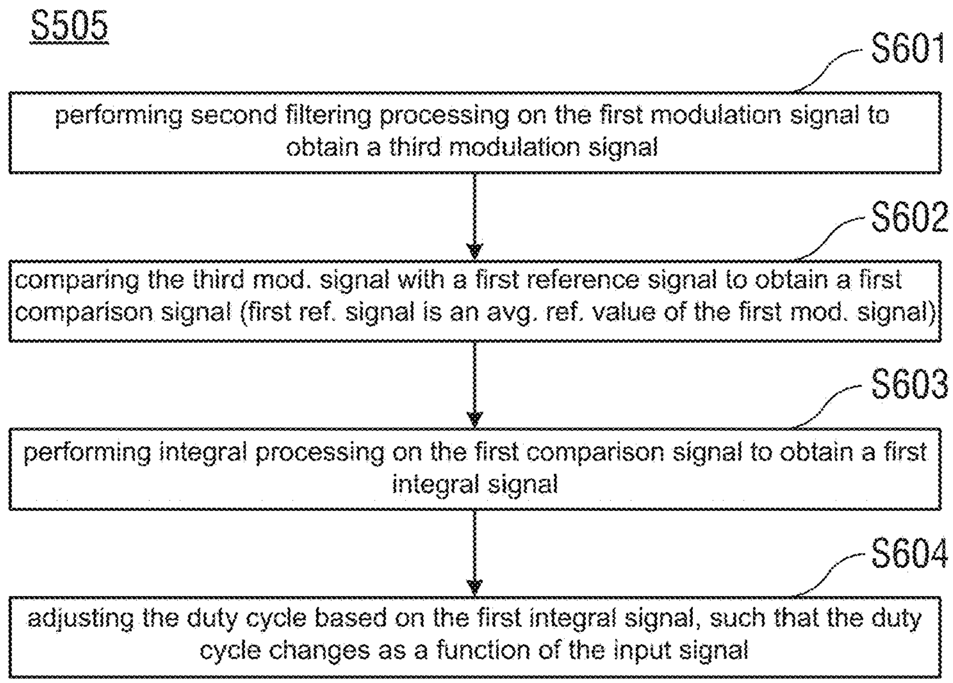
FIG. 6 is a flowchart of a feedback link in a power supply adjustment method according to an exemplary embodiment of the present disclosure.

FIG. 6 is a flowchart of a feedback link in a power supply adjustment method according to another embodiment of the present disclosure. Referring to FIG. 6, in some embodiments, the feedback step S505 includes:

S601: performing second filtering processing on the first modulation signal to obtain a third modulation signal;

S602: comparing the third modulation signal with a first reference signal to obtain a first comparison signal, where the first reference signal is an average reference value of the first modulation signal;

S603: performing integral processing on the first comparison signal to obtain a first integral signal; and S604: adjusting the duty cycle based on the first integral signal, such that the duty cycle changes as a function of the input signal.

In the embodiment, the duty cycle is slowly adjusted by using the feedback loop having an integration loop, so that in step S501, the duty cycle may be preset to a fixed value, when the input signal changes, the duty cycle may change slowly within a small range, and when the input signal is stable, the duty cycle may also be maintained at the fixed value.

Steps S502 to S504 are respectively the same as steps S202 to S204, and for details, reference may be made to the descriptions of the above embodiments.

The feedback step S505 includes steps S601 to S604. In step S601, second filtering processing may be performed on the first modulation signal, the second filtering processing may also be low-pass filtering processing, and a parameter for the second filtering processing may be different from that for the first filtering processing. Stability of the feedback loop may be implemented through the second filtering processing.

In step S602, the third modulation signal obtained after the second filtering processing may be compared with the first reference signal, for example, a difference is made between the third modulation signal and the first reference signal to obtain the first comparison signal. The first reference signal is an average reference value of the first modulation signal. It may be understood that a theoretical value of the first modulation signal is a reference value of the first modulation signal. Since the first modulation signal may form a signal with a duty cycle after PWM processing, an average value of the first modulation signal may be used to represent the first modulation signal, and an average value of theoretical values of the first modulation signal is the first reference signal.

In step S603, integral processing is performed on the first comparison signal, and the gain of the integral feedback is adjusted, so that the duty cycle may change slowly, thereby reducing interference of background noise of the bandwidth part on the portable component. In addition, to implement the negative feedback adjustment of the duty cycle, inversion processing may be included in the integral processing.

In step S604, when the input signal changes, the feedback loop may generate a signal to adjust the duty cycle, such that the duty cycle changes as a function of the input signal.

According to the method, the target signal may be maintained stable when the input signal fluctuates, and severe background noise may not be generated, so that requirements for a shielding component may be reduced, the size and weight of the portable component may be reduced, and the portability may be improved.

Figure 7:
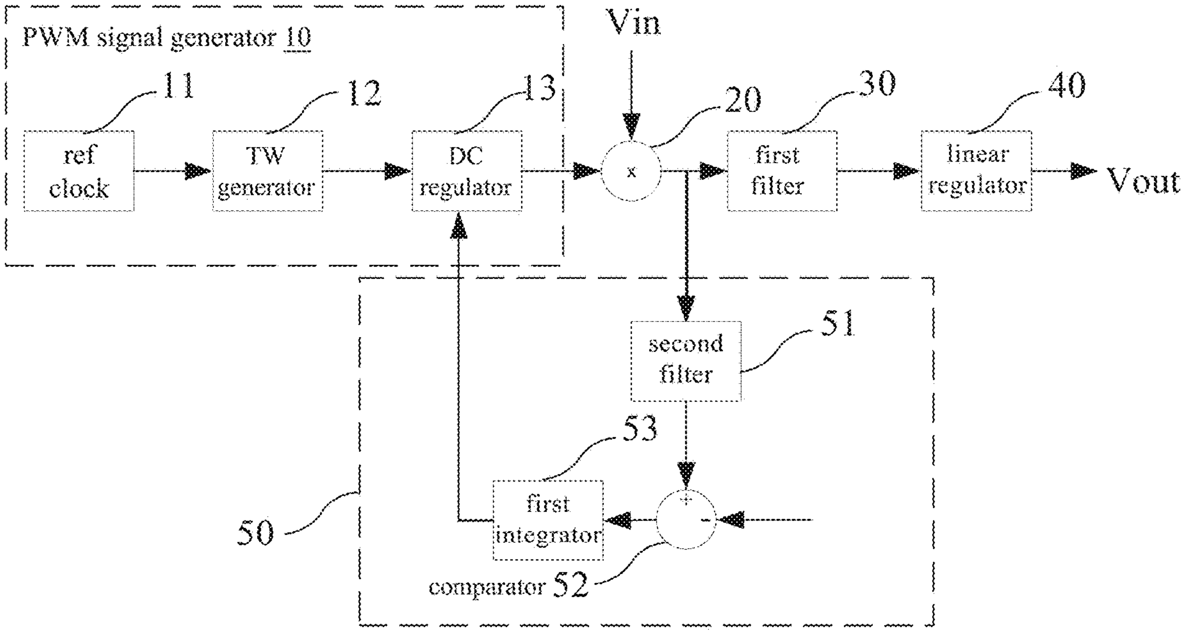
FIG. 7 is a schematic structural block diagram of a power supply apparatus according to an exemplary embodiment of the present disclosure and configured to implement the method in FIG. 5.

FIG. 7 is a schematic structural block diagram of a power supply apparatus implementing the method in FIG. 5 according to an embodiment of the present disclosure. Referring to FIG. 7, a feedback loop 50 is added in FIG. 7 on the basis of FIG. 3, thereby implementing slow adjustment of the duty cycle. In an exemplary embodiment, the feedback loop 50 and/or one or more components therein includes processing circuitry that is configured to perform one or more functions of the feedback loop 50 and/or respective functions of the component(s).

The feedback loop 50 may include a second filter 51. Step S601 may further include inputting the first modulation signal into the second filter 51 to obtain the third modulation signal, where the second filter 51 may be an LC low-pass filter or an RC low-pass filter, and when the second filter 51 is an RC low-pass filter, it may also maintain the stability of the feedback loop 50.

In addition, a bandwidth of the second filter 51 is less than or equal to 100 kHz, that is, within a range of ±100 kHz. Based on this range, interference of background noise on the portable component can be reduced, and slow adjustment of the duty cycle may also be implemented. The relatively slow speed is specific to the frequency of PWM. For adjustment with a frequency of 2.5 MHz, 1/20 of which, that is, about 100 kHz may be used.

The feedback loop 50 may further include a first comparator 52 and a first integrator 53, and the first comparator 52 and the first integrator 53 may be of common structures capable of implementing comparison and integration.

Figure 8:
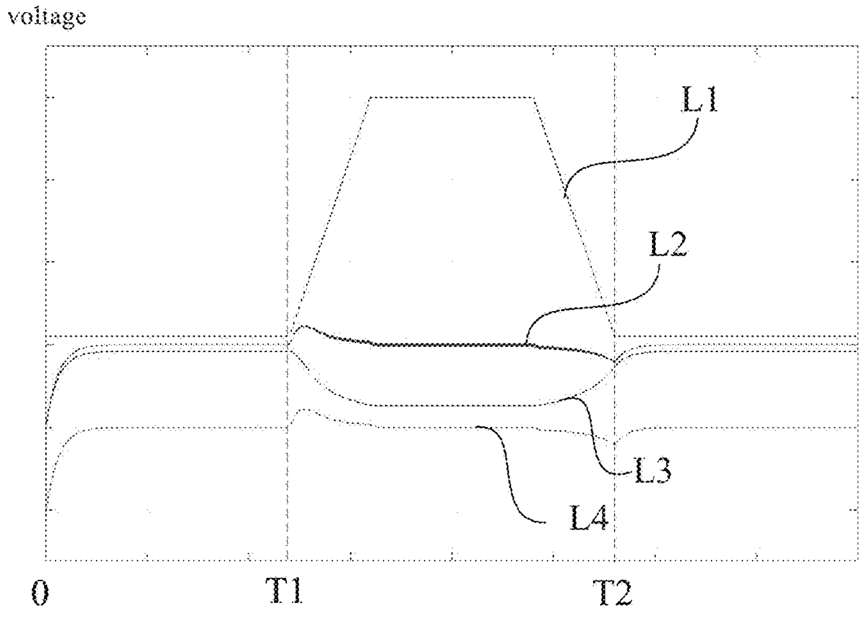
FIG. 8 is a diagram of a simulation result obtained when an input signal in FIG. 7 changes, according to an exemplary embodiment of the present disclosure.
Figure 9:
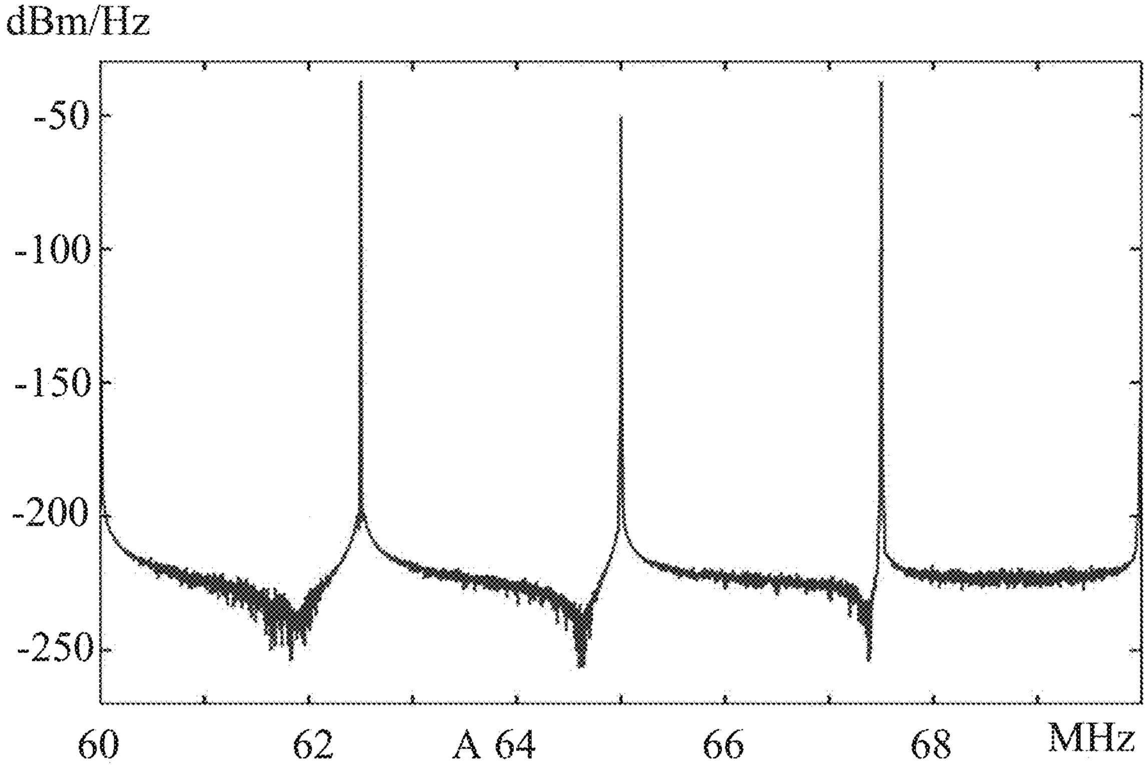
FIG. 9 is a diagram showing changes of power density of a second modulation signal in FIG. 7 as a function of frequency, according to an exemplary embodiment of the present disclosure.

FIG. 8 and FIG. 9 show curves of simulation results for the structure shown in FIG. 7. FIG. 8 is a diagram of a simulation result obtained when an input signal in FIG. 7 changes. FIG. 9 is a diagram showing changes of power density of a second modulation signal in FIG. 7 as a function of frequency. Referring to FIG. 8 and FIG. 9, in a specific embodiment, the first filter 30 is an LC low-pass filter, an inductance L is 100 nH, a capacitance C is 4 uF, and a frequency is 252 kHz; and the second filter 51 is an RC low-pass filter, a resistance R is 1 kOhm, a capacitance is 40 nF, a frequency is 4 kHz, a damping coefficient is 6.3, and a load is 2 Ohm.

In FIG. 8, L1 represents a change curve of the input signal Vin, a voltage value of the input signal Vin at a start moment is 5.5 V, it starts to rise to 20 V from the moment T1, maintains at 20 V until the moment T2, and decreases to 5.5 V from the moment T2.

L2 represents a change curve of the target signal Vout, L3 represents a change curve of the duty cycle, and L4 represents a change curve of an error. It can be seen that when the input signal changes, the duty cycle may be slowly changed by using the feedback loop, so that the voltage value of the target signal may be maintained as stable as possible.

In FIG. 9, the background noise of the second modulation signal obtained by using the first filter 30 may be basically limited to below −200 dBm/Hz, so that interference of the background noise on the portable component can be greatly reduced, and requirements for a shielding component can be reduced. −200 dBm/Hz refers to the background noise generated by PWM. Generally, there may be a thermal noise of −174 dBm/Hz in an electronic circuit at room temperature. The thermal noise is unavoidable at room temperature, so that all that is needed is to control an interference signal to be below −174 dBm/Hz.

Figure 10:
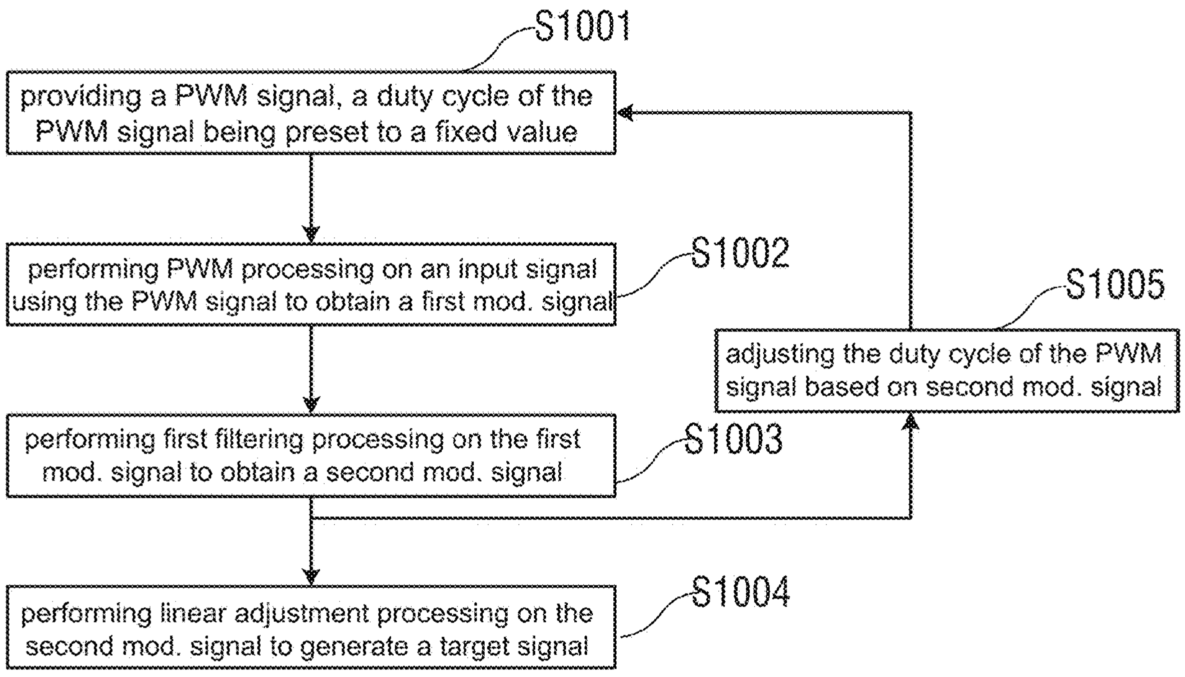
FIG. 10 is a flowchart of a power supply adjustment method according to an exemplary embodiment of the present disclosure.

FIG. 10 is a flowchart of a power supply adjustment method according to yet another embodiment of the present disclosure. Referring to FIG. 10, the embodiment further provides a power supply adjustment method. The method includes steps S1001 to S1005.

In step S1001, a PWM signal is provided, a duty cycle of the PWM signal being preset to a fixed value.

In step S1002, PWM processing is performed on an input signal by using the PWM signal to obtain a first modulation signal.

In step S1003, first filtering processing is performed on the first modulation signal to obtain a second modulation signal.

In step S1004, linear adjustment processing is performed on the second modulation signal to output a target signal.

The method further includes step S1005: using the second modulation signal as input of a feedback loop having an integration loop, and adjusting the duty cycle of the PWM signal in step S1001 by using the feedback loop.

Figure 11:
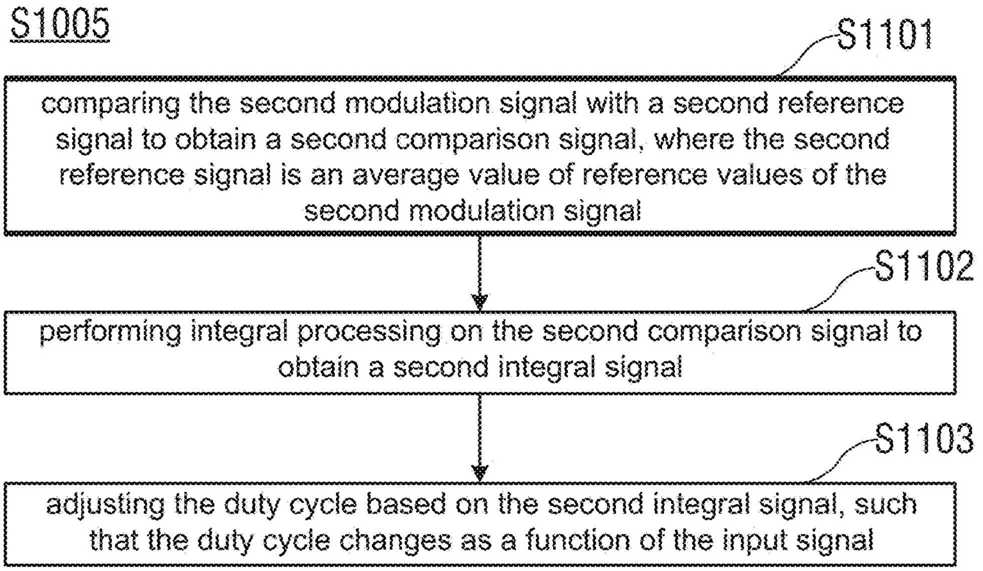
FIG. 11 is a flowchart of a feedback link in a power supply adjustment method according to an exemplary embodiment of the present disclosure.

FIG. 11 is a flowchart of a feedback link in a power supply adjustment method according to yet another embodiment of the present disclosure. In some embodiments, referring to FIG. 11, the feedback step S1005 includes:

step S1101: comparing the second modulation signal with a second reference signal to obtain a second comparison signal, where the second reference signal is an average value of reference values of the second modulation signal;

step S1102: performing integral processing on the second comparison signal to obtain a second integral signal; and step S1103: adjusting the duty cycle based on the second integral signal, such that the duty cycle changes as a function of the input signal.

In the embodiment, the duty cycle is slowly adjusted by using the feedback loop having an integration loop, but a setting method of the feedback loop is different from those in FIG. 5 and FIG. 6.

In step S1001, the duty cycle may be preset to a fixed value, when the input signal changes, the duty cycle may change slowly within a small range, and when the input signal is stable, the duty cycle may also be maintained at the fixed value.

Steps S1002 to S1004 are respectively the same as steps S202 to S204, and for details, reference may be made to the descriptions of the above embodiments.

The feedback step S1005 includes steps S1101 to S1103. In step S1101, the second modulation signal obtained after the first filtering processing may be compared with the second reference signal, for example, a difference is made between the second modulation signal and the second reference signal to obtain the second comparison signal. The second reference signal is an average reference value of the second modulation signal. It may be understood that a theoretical value of the second modulation signal is a reference value of the second modulation signal. Since the second modulation signal may form a signal with a duty cycle after PWM processing, an average value of the second modulation signal may be used to represent the second modulation signal, and an average value of theoretical values of the second modulation signal is the second reference signal.

In step S1102, integral processing is performed on the second comparison signal, and the gain of the integral feedback is adjusted, such that the duty cycle may change slowly, thereby reducing interference of background noise of the bandwidth part on the portable component. In addition, to implement the negative feedback adjustment of the duty cycle, inversion processing may be included in the integral processing.

In step S1103, when the input signal changes, the feedback loop may generate a signal to adjust the duty cycle, such that the duty cycle changes as a function of the input signal.

According to the method, the target signal may be maintained stable when the input signal fluctuates, and severe background noise may not be generated, so that requirements for a shielding component may be reduced, a size and a weight of the portable component may be reduced, and portability may be improved. However, compared to the method illustrated in FIG. 6, more careful adjustment of relevant parameters of the feedback loop is required in the method illustrated in FIG. 11.

Figure 12:
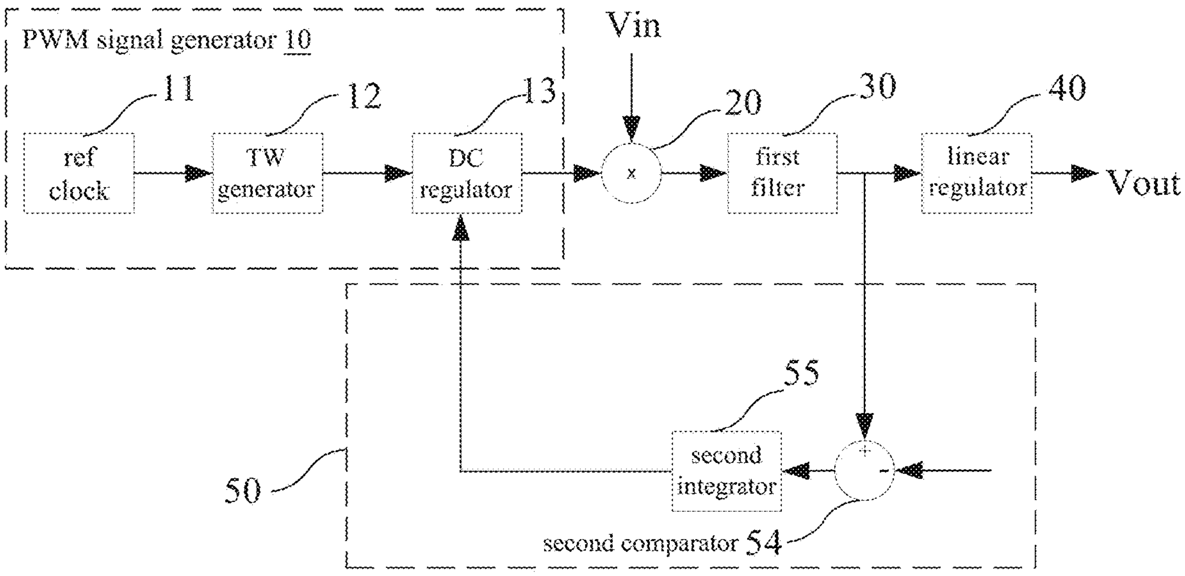
FIG. 12 is a schematic structural block diagram of a power supply apparatus according to an exemplary embodiment of the present disclosure, and configured to implement the method in FIG. 10.

FIG. 12 is a schematic structural block diagram of a power supply apparatus implementing the method in FIG. 10 according to an embodiment of the present disclosure. Referring to FIG. 12, a feedback loop 50 is added in FIG. 12 on the basis of FIG. 3, thereby implementing slow adjustment of the duty cycle. The second modulation signal is used as input of the feedback loop 50, the feedback loop 50 may include a second comparator 54 and a second integrator 55, and the second comparator 54 and the second integrator 55 may be of common structures capable of implementing comparison and integration. In an exemplary embodiment, the feedback loop 50 and/or one or more components therein includes processing circuitry that is configured to perform one or more functions of the feedback loop 50 and/or respective functions of the component(s).

On the basis of the above embodiment, step S203 includes: inputting the first modulation signal into the first filter 30 to obtain the second modulation signal, where the first filter 30 is an LC low-pass filter, so as to maintain the stability of the feedback loop. In addition, a relatively small parameter may be selected for the inductance L, thereby reducing DC losses.

Figure 13:
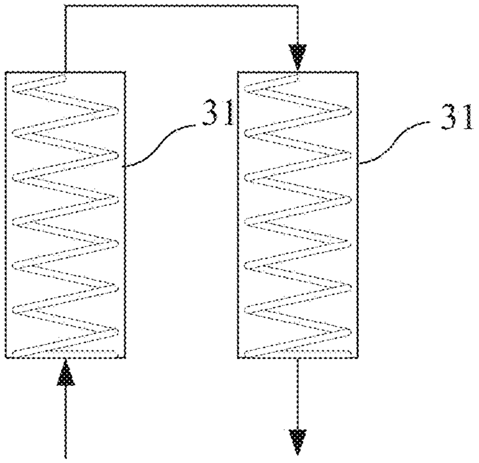
FIG. 13 is a diagram of a partial structure of an inductor in a first filter according to an exemplary embodiment of the present disclosure.

FIG. 13 is a structural diagram of an inductor in a first filter according to an embodiment of the present disclosure. Referring to FIG. 13, in some embodiments, the first filter 30 may include two inductors 31, the two inductors 31 are arranged in series, a current may flow through the two inductors 31 in sequence, and the two inductors 31 are arranged side by side and spaced apart, so that electromagnetic radiation generated during operation of the first filter 30 may be reduced, mutual inductance between the first filter and an induction element such as an antenna in the portable component may be reduced, and an impact on the portable component may be further reduced.

Still referring to FIG. 3, the embodiment further provides a power supply apparatus, including: a PWM signal generator 10, an input signal processor (for example, a multiplier) 20, a first filter 30, and a linear regulator 40.

The PWM signal generator 10 is configured to provide a PWM signal, a duty cycle of the PWM signal being preset to a fixed value. The input signal processor (for example, a multiplier) 20 is configured to perform PWM processing on an input signal by using the PWM signal to obtain a first modulation signal. An input terminal of the first filter 30 is connected to the input signal processor 20, and the first filter 30 is configured to perform first filtering processing on the first modulation signal to obtain a second modulation signal. An input terminal of the linear regulator 40 is connected to an output terminal of the first filter 30, and the linear regulator 40 is configured to perform linear adjustment processing on the second modulation signal to output a target signal.

Structures and functions of the PWM signal generator 10, the input signal processor 20, the first filter 30, and the linear regulator 40 are the same as those in the above embodiments. For details, reference may be made to the above embodiments, which is not repeated herein.

The power supply apparatus provided in the embodiment can reduce requirements for a shielding component, reduce a size and a weight of the portable component, and make the portable component easy to carry. In addition, the input signal is adjusted through PWM processing, so that power consumption may be reduced, voltage adjustment can be efficiently implemented, an impact of the voltage adjustment process on the portable component can be reduced, and good electromagnetic compatibility can be implemented.

In some embodiments, as shown in FIG. 7 and FIG. 12, the power supply apparatus further includes: a feedback loop 50 having an integration loop, where the feedback loop 50 is configured to adjust the duty cycle of the PWM signal, and the first modulation signal or the second modulation signal is used as input of the feedback loop, thereby making the duty cycle be adjusted at a relatively slow speed. Due to a slow change of the duty cycle, severe background noise may not be generated, so that the requirements for a shielding component may be reduced, and stable output may be implemented.

In some embodiments, referring to FIG. 7, the power supply apparatus further includes: a second filter 51, a first comparator 52, and a first integrator 53.

An input terminal of the second filter 51 is connected to the input terminal of the first filter 30, and the second filter 51 is configured to perform second filtering processing on the first modulation signal to obtain a third modulation signal.

An input terminal of the first comparator 52 is connected to an output terminal of the second filter 51, and the first comparator 52 is configured to compare the third modulation signal with a first reference signal to obtain a first comparison signal, where the first reference signal is an average reference value of the first modulation signal.

An input terminal of the first integrator 53 is connected to an output terminal of the first comparator 52, and the first integrator 53 is configured to perform integral processing on the first comparison signal to obtain a first integral signal, where the PWM signal generator 10 is further configured to adjust the duty cycle based on the first integral signal, such that the duty cycle changes as a function of the input signal.

According to the power supply apparatus, the target signal may be maintained stable when the input signal fluctuates, and severe background noise may not be generated, so that requirements for a shielding component may be reduced, a size and a weight of the portable component may be reduced, and portability may be improved.

In some embodiments, the second filter 51 is an LC low-pass filter or an RC low-pass filter, and when the second filter 51 is an RC low-pass filter, it can also maintain the stability of the feedback loop.

In addition, a bandwidth of the second filter 51 is less than or equal to 100 kHz, that is, within a range of ±100 kHz. Based on this range, interference of background noise on the portable component can be reduced, and slow adjustment of the duty cycle may also be implemented.

In some embodiments, referring to FIG. 12, the power supply apparatus further includes: a second comparator 54 and a second integrator 55.

An input terminal of the second comparator 54 is connected to the output terminal of the first filter 30, and the second comparator 54 is configured to compare the second modulation signal with a second reference signal to obtain a second comparison signal, where the second reference signal is an average value of reference values of the second modulation signal.

An input terminal of the second integrator 55 is connected to the output terminal of the second comparator 54, and the second integrator 55 is configured to perform integral processing on the second comparison signal to obtain a second integral signal, where the PWM signal generator 10 is further configured to adjust the duty cycle based on the second integral signal, such that the duty cycle changes as a function of the input signal.

According to the method, the target signal may be maintained stable when the input signal fluctuates, and severe background noise may not be generated, so that requirements for a shielding component may be reduced, a size and a weight of the portable component may be reduced, and portability may be improved.

In some embodiments, in FIG. 13, the first filter 30 may include two inductors 31, the two inductors 31 are arranged in series, a current may flow through the two inductors 31 in sequence, and the two inductors 31 are arranged side by side and spaced apart, so that electromagnetic radiation generated during operation of the first filter 30 may be reduced, mutual inductance between the first filter and an induction element such as an antenna in the portable component may be reduced, and an impact on the portable component may be further reduced.

In some embodiments, a voltage value of the second modulation signal is higher than that of the target signal, so that the loss of the linear regulator 40 may be avoided from affecting the voltage value of the target signal.

It may be understood that structures and functions of each part in the power supply apparatus are the same as those in the above embodiments. For details, reference may be made to the above embodiments.

Figure 14:
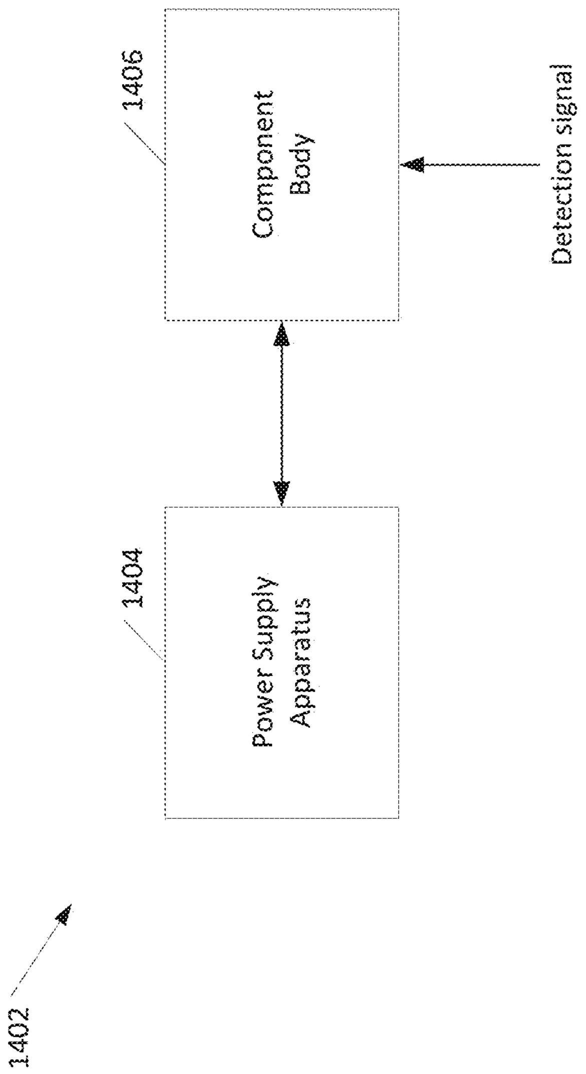
FIG. 14 illustrates a portable component according to an exemplary embodiment of the present disclosure.

FIG. 14 illustrates a portable component 1402 according to an exemplary embodiment. The portable component 1402 may be used in a magnetic resonance device. The portable component 1402 may include a power supply apparatus 1404 and a component body 1406 configured to receive a detection signal, the power supply apparatus 1404 being connected to the component body 1406, to supply power to the component body 1406.

The component body 1406 may be of a structure such as a receiving antenna configured to receive a detection signal. A structure and a function of the power supply apparatus 1404 are the same as those in the above embodiments, or the power supply apparatus 1404 may perform the above power supply adjustment method. For details, reference may be made to the above embodiments, which is not repeated herein.

According to the portable component 1402 provided in the embodiment, interference of noise generated by PWM on the operation of the portable component 1402 can be reduced, thereby reducing requirements for shielding components, further reducing a weight of the portable component, and improving portability.

Figure 15:
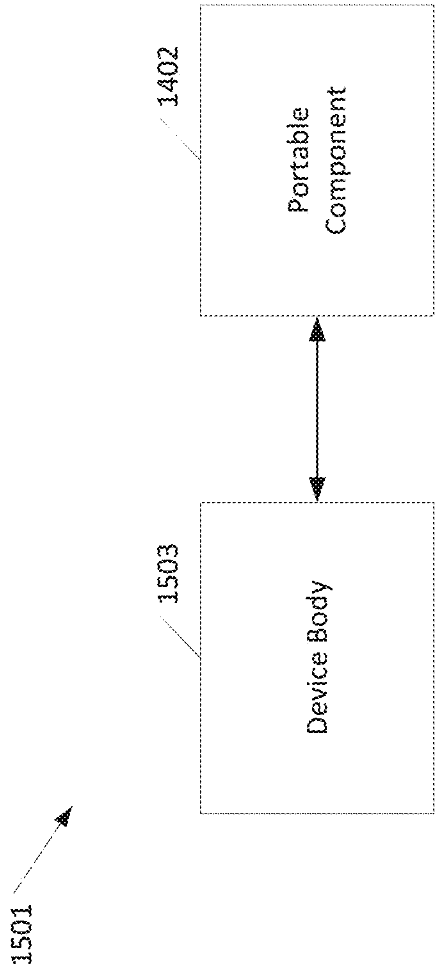
FIG. 15 illustrates a magnetic resonance device according to an exemplary embodiment of the present disclosure.

FIG. 15 illustrates a magnetic resonance device 1501 according to an exemplary embodiment. The magnetic resonance device 1501 may include a device body 1503 and the portable component 1402, the portable component 1402 being communicatively connected to the device body 1503. The magnetic resonance device 1501 may include one or more well-known components, such as a scanner and a controller configured to control the scanner.

The device body 1503 may be provided according to types of magnetic resonance devices, structures and functions of the portable component 1402 are the same as those in the above embodiments. For details, reference may be made to the above embodiments, which is not repeated herein. Communication between the portable component 1402 and the device body 1503 may be implemented in a common wireless communication manner.

In addition, in some embodiments, the portable component 1402 may be independent of the device body 1503, that is, there may be no connection cable between the two, and the portable component 1402 may be provided with power independently by relying on a power supply apparatus provided therein, so that the use of the portable component 1402 may be made more flexible.

In some other embodiments, the portable component 1402 may be connected to the device body 1503 through a connection cable, so as to obtain required power from the device body 1503.

According to the magnetic resonance device 1501 provided in the embodiment, the portable component 1402 has a small size and low weight and is easy to carry, so that the magnetic resonance device 1501 may be applicable to various application scenarios and is highly flexible.

The above descriptions are merely embodiments of the present disclosure, but are not intended to limit the present disclosure. Any modification, equivalent replacement, or improvement made without departing from the spirit and principle of the present disclosure shall fall within the protection scope of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

10: PWM signal generator
11: reference clock
12: triangular wave generator
13: duty cycle regulator
20: input signal processor
30: first filter
31: inductor
40: linear regulator
50: feedback loop
51: second filter
52: first comparator
53: first integrator
54: second comparator
55: second integrator
1402: portable component
1404: power supply apparatus
1406: component body
1501: magnetic resonance device
1503: device body

The invention claimed is:

1. A power supply adjustment method applied to a portable component of a magnetic resonance device, comprising:
- providing a pulse-width modulation (PWM) signal, a duty cycle of the PWM signal being preset to a fixed value;
- performing PWM processing on an input signal, based on the PWM signal, to determine a first modulation signal;
- performing first filtering processing on the first modulation signal to determine a second modulation signal;
- adjusting the duty cycle of the PWM signal based on a feedback loop having an integration loop, wherein the first modulation signal or the second modulation signal is used as input of the feedback loop; and
- performing linear adjustment processing on the second modulation signal to generate a target signal and providing the target signal to the portable component to supply power to the portable component of the magnetic resonance device.

2. The method as claim 1, further comprising:
- performing second filtering processing on the first modulation signal to determine a third modulation signal;
- comparing the third modulation signal with a first reference signal to determine a first comparison signal, wherein the first reference signal is an average reference value of the first modulation signal;
- performing integral processing on the first comparison signal to determine a first integral signal; and
- adjusting the duty cycle based on the first integral signal such that the duty cycle changes based on the input signal.

3. The method as claimed in claim 2, wherein performing second filtering processing on the first modulation signal to determine a third modulation signal comprises:
- inputting the first modulation signal into a second filter to determine the third modulation signal, wherein the second filter is an LC low-pass filter or an RC low-pass filter, and a bandwidth of the second filter is less than or equal to 100 KHz.

4. The method as claimed in claim 1, further comprising:
- comparing the second modulation signal with a second reference signal to determine a second comparison signal, wherein the second reference signal is an average value of reference values of the second modulation signal;
- performing integral processing on the second comparison signal to determine a second integral signal; and
- adjusting the duty cycle based on the second integral signal, such that the duty cycle changes based on the input signal.

5. The method as claimed in claim 1, wherein performing first filtering processing on the first modulation signal to determine a second modulation signal comprises:
inputting the first modulation signal into a first filter to determine the second modulation signal,
wherein the first filter is an LC low-pass filter, the first filter includes two inductors arranged in series, side by side, and spaced apart.

6. The method as claimed in claim 1, wherein a voltage value of the second modulation signal is higher than that of the target signal.

7. The method as claimed in claim 1, wherein the integration loop is configured to limit a rate of change of the duty cycle to reduce background noise generated by the PWM processing.

8. The method as claimed in claim 1, wherein a rate of adjustment of the duty cycle is less than or equal to 1/20 of a frequency of the PWM signal.

9. The method as claimed in claim 1, wherein the feedback loop is configured to adjust the duty cycle such that background noise generated by the PWM processing is below a thermal noise level of the portable component.

10. The method as claimed in claim 1, wherein the integration loop comprises inversion processing to implement negative feedback adjustment of the duty cycle.

11. A power supply apparatus for a portable component of a magnetic resonance device, comprising:
a PWM signal generator configured to provide a PWM signal, a duty cycle of the PWM signal being preset to a fixed value;
an input signal processor configured to perform PWM processing on an input signal to determine a first modulation signal based on the PWM signal;
a first filter, an input terminal of the first filter being connected to the input signal processor, and the first filter being configured to perform first filtering processing on the first modulation signal to obtain a second modulation signal;
a feedback loop having an integration loop and configured to adjust the duty cycle of the PWM signal, wherein the first modulation signal or the second modulation signal is used as input of the feedback loop; and
a linear regulator, an input terminal of the linear regulator being connected to an output terminal of the first filter, and the linear regulator being configured to perform linear adjustment processing on the second modulation signal to determine a target signal and provide the target signal as an output of the linear regulator, the target signal to the portable component to supply power to the portable component of the magnetic resonance device.

12. The power supply apparatus as claim 11, further comprising:
a second filter, an input terminal of the second filter being connected to the input terminal of the first filter, and the second filter being configured to perform second filtering processing on the first modulation signal to determine a third modulation signal;
a first comparator, an input terminal of the first comparator being connected to an output terminal of the second filter, and the first comparator being configured to compare the third modulation signal with a first reference signal to determine a first comparison signal, wherein the first reference signal is an average reference value of the first modulation signal; and
a first integrator, an input terminal of the first integrator being connected to an output terminal of the first comparator, and the first integrator being configured to perform integral processing on the first comparison signal to determine a first integral signal,
wherein the PWM signal generator is further configured to adjust the duty cycle based on the first integral signal, such that the duty cycle changes based on the input signal.

13. The power supply apparatus as claimed in claim 12, wherein the second filter is an LC low-pass filter or an RC low-pass filter, and a bandwidth of the second filter is less than or equal to 100 kHz.

14. The power supply apparatus as claim 11, further comprising:
a second comparator, an input terminal of the second comparator being connected to the output terminal of the first filter, and the second comparator being configured to compare the second modulation signal with a second reference signal to determine a second comparison signal, wherein the second reference signal is an average value of reference values of the second modulation signal; and
a second integrator, an input terminal of the second integrator being connected to the output terminal of the second comparator, and the second integrator being configured to perform integral processing on the second comparison signal to determine a second integral signal,
wherein the PWM signal generator is further configured to adjust the duty cycle based on the second integral signal, such that the duty cycle changes based on the input signal.

15. The power supply apparatus as claimed in claim 11, wherein the first filter is an LC low-pass filter, the first filter includes two inductors, and the two inductors are arranged in series, side by side, and spaced apart.

16. A portable component used in a magnetic resonance device, comprising:
a component body configured to receive a detection signal; and
the power supply apparatus connected to the component body to supply power to the component body, the power supply apparatus being configured to:
provide a pulse-width modulation (PWM) signal, a duty cycle of the PWM signal being preset to a fixed value;
perform PWM processing on an input signal, based on the PWM signal, to determine a first modulation signal;
filter the first modulation signal to determine a second modulation signal;
adjust the duty cycle of the PWM signal based on a feedback loop having an integration loop, wherein the first modulation signal or the second modulation signal is used as input of the feedback loop; and
perform linear adjustment processing on the second modulation signal to generate a target signal, wherein the power supply apparatus is configured to provide the target signal to the component body to supply power tot the component body of the portable component used in the magnetic resonance device.

17. A magnetic resonance device, comprising:
a device body; and
the portable component as claimed in claim 16, the portable component being communicatively connected to the device body.

* * * * *